(12) United States Patent
Matsukawa et al.

(10) Patent No.: US 12,426,487 B2
(45) Date of Patent: Sep. 23, 2025

(54) ORGANIC DEVICE AND METHOD FOR PRODUCING ORGANIC DEVICE

(71) Applicant: Panasonic Intellectual Property Management Co., Ltd., Osaka (JP)

(72) Inventors: Nozomu Matsukawa, Nara (JP); Katsuya Nozawa, Osaka (JP); Shinichi Machida, Osaka (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 588 days.

(21) Appl. No.: 17/809,026

(22) Filed: Jun. 27, 2022

(65) Prior Publication Data
US 2022/0336745 A1 Oct. 20, 2022

Related U.S. Application Data

(63) Continuation of application No. PCT/JP2020/044134, filed on Nov. 27, 2020.

(30) Foreign Application Priority Data

Jan. 14, 2020 (JP) .................... 2020-003718

(51) Int. Cl.
*H01L 51/50* (2006.01)
*H10K 30/30* (2023.01)
(Continued)

(52) U.S. Cl.
CPC ............. *H10K 71/12* (2023.02); *H10K 30/30* (2023.02); *H10K 30/353* (2023.02); *H10K 30/82* (2023.02);
(Continued)

(58) Field of Classification Search
None
See application file for complete search history.

(56) References Cited

U.S. PATENT DOCUMENTS

2007/0231467 A1  10/2007  Takashima et al.
2011/0049665 A1  3/2011  Goto
(Continued)

FOREIGN PATENT DOCUMENTS

JP  2011-054746 A  3/2011
JP  2011-187918    9/2011
(Continued)

OTHER PUBLICATIONS

International Search Report of PCT application No. PCT/JP2020/044134 dated Feb. 16, 2021.
(Continued)

*Primary Examiner* — Gregory D Clark
(74) *Attorney, Agent, or Firm* — Rimon P.C.

(57) ABSTRACT

An organic device includes at least one electrode, an insulating layer adjacent to the at least one electrode in a plan view, and an organic layer that is continuously in contact with an upper surface of the at least one electrode and an upper surface of the insulating layer. The organic layer contains a polymer of an organic material. The organic material contains a basic molecular skeleton and a polymerizable functional group. In the polymer, the organic material is polymerized through the polymerizable functional group.

12 Claims, 4 Drawing Sheets

(51) Int. Cl.
*H10K 30/82* (2023.01)
*H10K 39/32* (2023.01)
*H10K 71/12* (2023.01)
*H10K 30/00* (2023.01)
*H10K 85/60* (2023.01)

(52) U.S. Cl.
CPC .......... *H10K 39/32* (2023.02); *H10K 30/451* (2023.02); *H10K 85/626* (2023.02); *H10K 85/633* (2023.02); *H10K 85/636* (2023.02); *H10K 85/653* (2023.02)

(56) References Cited

U.S. PATENT DOCUMENTS

| | | |
|---|---|---|
| 2011/0194000 A1 | 8/2011 | Suzuki et al. |
| 2012/0080675 A1 | 4/2012 | Nakatani et al. |
| 2013/0206966 A1 | 8/2013 | Mitsui et al. |
| 2014/0217372 A1 | 8/2014 | Shim et al. |
| 2016/0276602 A1 | 9/2016 | Yoshinaga et al. |
| 2016/0315265 A1* | 10/2016 | Burroughes .......... C09K 11/025 |

FOREIGN PATENT DOCUMENTS

| | | |
|---|---|---|
| JP | 2012-079897 A | 4/2012 |
| JP | 2012-094810 | 5/2012 |
| JP | 2013-051385 | 3/2013 |
| JP | 2014-034618 | 2/2014 |
| JP | 2014-204102 | 10/2014 |
| JP | 2017-157801 | 9/2017 |
| WO | 2010/067792 | 6/2010 |
| WO | 2018/079323 | 5/2018 |

OTHER PUBLICATIONS

Jixian Xu et al., "Crosslinked Remote-Doped Hole-Extracting Contacts Enhance Stability under Accelerated Lifetime Testing in Perovskite Solar Cells", Advanced Materials, 2016, 28, Jan. 29, 2016, 2807-2815.

Chi-Yen Lin et al., "A thermally cured 9,9-diarylfluorene-based triaryldiamine polymer displaying high hole mobility and remarkable ambient stability", Journal of Materials Chemistry, 2009, 19, Apr. 21, 2009, 3618-3623.

The EPC Office Action dated Aug. 10, 2023 for the related European Patent Application No. 20914530.9.

Cheng Y-J et al: "Thermally Cross-Linkable Hole-Transporting Materials on Conducting Polymer: Synthesis, Characterization, and Applications for Polymer Light-Emitting Devices", Chemistry of Materials, American Chemical Society, US, vol. 20, No. 2, Jan. 22, 2007 (Jan. 22, 2007), pp. 413-422, XP002578428.

The EPC Office Action dated Jan. 3, 2025 for the related European Patent Application No. 20914530.9.

* cited by examiner

ORGANIC DEVICE AND METHOD FOR PRODUCING ORGANIC DEVICE

BACKGROUND

1. Technical Field

The present disclosure relates to an organic device that includes an organic thin film as one part of the constituent elements, etc.

2. Description of the Related Art

An organic device is a device, such as an organic electroluminescence (EL), an organic solar cell, or an organic imaging element, that contains an organic material as a constituent element.

Some of these organic devices include an organic thin film interposed between a substrate, an insulating layer, an electrode, etc. In such organic devices, surfaces of a substrate, an insulating layer, an electrode, etc., on which an organic thin film is to be formed are not homogeneous due to necessity of forming electrical connections and circuits.

When a printing method or an applying method is employed to form a film of an organic material, the organic material is dissolved in a solvent to form an ink, the ink is applied to a substrate, and the solvent therein is evaporated to form a thin film. When the area and pitch of the pixel electrodes are relatively large, such as in organic EL displays for televisions, it is possible to separately apply organic thin films to respective pixels. However, in an organic device, such as an organic imaging element, that has high-density, reduced-size pixels, an organic thin film must be formed to simultaneously cover the reduced-size pixel electrodes and the insulating layers that isolate these electrodes.

As the organic material to be dissolved, various forms of organic materials, such as low-molecular-weight materials and high-molecular-weight materials, have been developed. For example, Japanese Unexamined Patent Application Publication No. 2014-034618 and Jixian Xu et al., "Crosslinked Remote-Doped Hole-Extracting Contacts Enhance Stability under Accelerated Lifetime Testing in Perovskite Solar Cells" (Advanced Materials, 2016, vol. 28, pp. 2807-2815) disclose, as a polymerizable organic material to be used in organic devices, materials that are used in barrier layers or photoelectric conversion layers of solar cells. In addition, for example, Chi-Yen Lin et al., "A thermally cured 9,9-diarylfluorene-based triaryldiamine polymer displaying high hole mobility and remarkable ambient stability" (Journal of Material Chemistry, 2009, vol. 19, pp. 3618-3623) discloses, as a polymerizable organic material to be used in organic devices, materials used in barrier layers of light emitting diodes (LEDs).

SUMMARY

In one general aspect, the techniques disclosed here feature an organic device that includes at least one electrode, an insulating layer adjacent to the at least one electrode in a plan view, and an organic layer that is continuously in contact with an upper surface of the at least one electrode and an upper surface of the insulating layer, and that contains a polymer of an organic material. The organic material contains a basic molecular skeleton and a polymerizable functional group, and, in the polymer, the organic material is polymerized through the polymerizable functional group.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Organic devices equipped with organic thin films are required to achieve uniformity of device characteristics that involve functions of the organic devices. Thus, the present disclosure aims to provide an organic device etc., with which the uniformity of device characteristics can be improved.
Findings that have LED to Embodiments of the Present Disclosure The present inventors have found that, in organic devices, in particular, in an organic device in which an organic thin film is formed on a heterogeneous surface where two or more components are exposed, the following issues arise in improving the uniformity of the device characteristics.

In the disclosed examples described above, an organic thin film is formed on a homogenous surface of one component, and an organic thin film that extends across and covers a heterogeneous surface where two or more components are exposed is not formed. Moreover, in the disclosed examples described above, the effects that the organic thin film formed on a heterogeneous surface where two or more components are exposed has on the organic device are not clarified.

In the applying or printing process, as the solution containing a dissolved organic material wets and spreads over a surface to be coated or as the volume of the solution containing a dissolved organic material decreases during drying, the shape and the internal structure undergo changes toward decreasing the total of the internal energy of the solution itself, the external force applied by the process, the interfacial energy between the solid and the solution, etc. For a shape, such as a thin film, that has a large surface area-to-volume ratio, the interfacial energy has large influence.

An organic thin film formed on a heterogeneous surface such as a surface where two or more components are exposed is affected by nonuniform interfacial energy. In particular, a high-molecular-weight material, such as a polymer of an organic material, has stronger interaction between polymer chains compared to a low-molecular-weight organic material, and the counteraction of the increased viscosity of the solution containing the dissolved high-molecular-weight material is that the microstructure, such as molecular chain alignment, becomes susceptible to the influence of the fluxional process of the solution.

Meanwhile, in an organic imaging device, which is one type of organic devices, an organic thin film formed as a part of pixels is required to have uniform characteristics within the pixel electrode arrays in order to improve the uniformity of the device characteristics. Nonuniform interfacial energy generated from a heterogeneous surface constituted by the pixel electrodes and the insulating layer isolating the pixel electrodes generates a bias in characteristics, such as the thickness and alignment of the organic thin film, through a fluxional process of the solution containing a dissolved high-molecular-weight material. In other words, the fluxional process of the high-molecular-weight material solution may cause, for example, nonuniformity in alignment of the high-molecular-weight material and nonuniformity in film thickness in the organic thin film. Due to the bias in these characteristics, some parts of a displayed image or captured image may become prone to noise, and the uniformity of the device characteristics on the surface where the organic thin film is formed is degraded. In the case of a low-molecular-weight organic material, the molecular chain interactions such as those found in a high-molecular-weight material do not occur, and thus the interaction between the organic material molecules is small, and the boundaries of dissimilar materials have little influence during the application process. However, there is a possibility that, after the film formation, cracks and the like attributable to dissimilar material boundaries may occur in the organic thin film. As a result, device characteristics nonuniformity may occur.

The present disclosure provides, for example, an organic device in which an organic thin film is formed on a surface where two or more components are exposed, with which the uniformity of the device characteristics on the surface where an organic thin film is formed can be improved.

The summary of aspects of the present disclosure is as follows.

An organic device according to one aspect of the present disclosure includes at least one electrode, an insulating layer adjacent to the at least one electrode in a plan view, and an organic layer that is continuously in contact with an upper surface of the at least one electrode and an upper surface of the insulating layer. The organic layer contains a polymer of an organic material. The organic material contains a basic molecular skeleton and a polymerizable functional group. In the polymer, the organic material is polymerized through the polymerizable functional group.

In this manner, the organic layer that contains a polymer of an organic material, which is a high-molecular-weight material, is formed to extend across an upper surface of a structure in which dissimilar materials, such as an insulating layer and an electrode, are adjacent to each other. The polymer of the organic material has a large interaction between polymer chains, and, thus, compared to a low-molecular-weight material, cracks caused by the influence of the boundary between dissimilar materials rarely occur in the organic layer, and, the uniformity of the device characteristics of the organic device of this aspect is improved on the surface on which the organic layer is formed.

Since the organic material contains the basic molecular skeleton and the polymerizable functional group, the functionality can be easily imparted to the organic layer without using other materials if the basic molecular skeleton has a functionality.

In addition, for example, the polymer of the organic material may be insoluble in a solvent.

Such a polymer of an organic material that is insoluble in a solvent cannot be dissolved in a solvent and applied; thus, polymerization occurs on the upper surfaces of the insulating layer and the electrode, or a polymer of the organic material is preliminarily formed into a thin film and stacked, for example. Thus, the step of applying a solution of the organic material polymer is not employed, and a bias in the characteristics of the polymer of the organic material caused by the influence of the flux on the boundaries of dissimilar materials is suppressed. In other words, the uniformity of the organic layer is enhanced. Thus, the uniformity of device characteristics is improved. In addition, since the polymer of the organic material is insoluble in a solvent, when an additional layer is formed on the organic layer by coating using a solvent, the solvent used in forming the additional layer less affects the device characteristics, and thus degradation of the device characteristics is suppressed.

Furthermore, for example, the organic layer may contain the organic material that contains the polymerizable functional group that is unpolymerized.

In this manner, when the microstructure of the organic layer changes due to a heat treatment, stress, or the like performed subsequently, a not-yet-polymerized polymerizable functional group that has moved to a new reactive site is polymerized, and thus the stability of the microstructure of the film is increased, and the uniform state of the organic layer can be retained.

Furthermore, for example, the organic layer may include the polymer of the organic material polymerized after the organic material is applied to the upper surface of the at least one electrode and the upper surface of the insulating layer.

In this manner, since a not-yet-polymerized organic material is applied to the upper surface of the structure in which dissimilar materials, such as the insulating layer and the electrode, are adjacent to each other, there is no interaction between polymer chains compared to when the organic material in a polymer state is applied. Thus, the polymer of the organic material polymerized after application exhibits less bias in characteristics, such as thickness and alignment, caused by the influence of the flux on the boundary between the dissimilar materials. Thus, the nonuniformity of the device characteristics caused by the bias in these characteristics can be suppressed, and the uniformity of the device characteristics is improved.

Furthermore, for example, the at least one electrode may include a plurality of electrodes, the insulating layer may be disposed between the plurality of electrodes in a plan view, and the organic layer may be continuously in contact with upper surfaces of the plurality of electrodes and the upper surface of the insulating layer.

In this manner, even when the insulating layer is positioned between the electrodes, the organic layer is formed to extend across the electrodes and the insulating layer. Thus, in the organic layer, the uniformity on the boundaries between the electrodes and the insulating layer and the uniformity between the boundary between the insulating layer and a particular electrode and the boundary between another electrode and the insulating layer are improved.

Furthermore, for example, a width of the insulating layer between adjacent two electrodes among the plurality of electrodes in a plan view may be larger than a thickness of the organic layer.

In this manner, since the thickness of the organic layer is smaller than the width of the insulating layer between the adjacent two electrodes, the influence of the boundary between the dissimilar materials easily spreads in the thickness direction of the organic layer when the high-molecular-weight material-containing solvent is applied, and thus the effect of improving the uniformity of the device characteristics is prominent.

Furthermore, for example, the organic device may further include a photoelectric conversion layer disposed on the organic layer, and the plurality of electrodes may be pixel electrodes.

In this manner, charges generated in the photoelectric conversion layer by irradiation with light are collected by the pixel electrodes, and an image can be captured. Thus, by using the organic device of this aspect, an organic imaging device with which the uniformity of the device characteristics is improved can be realized.

Furthermore, the organic layer may be a charge block layer.

In this manner, since the organic layer functions as a charge block layer, injection of unnecessary charges from the pixel electrodes to the photoelectric conversion layer is suppressed. As a result, noise reduction can be achieved in an organic imaging device that includes the organic device of this aspect.

Furthermore, the basic molecular skeleton may be a π-conjugated molecular skeleton.

In this manner, charges are transported in the organic layer through the overlap between the π orbitals of the basic molecular skeleton, and thus a charge transport function can be imparted to the organic layer.

Furthermore, for example, the π-conjugated molecular skeleton may be a triphenylamine skeleton, a fluorene skeleton, a triphenylene skeleton, or a carbazole skeleton.

In this manner, since the organic material contains a basic molecular skeleton having a large number of π electrons, the energy level of the molecular orbital of the polymer of the organic material can be easily adjusted to an energy level suitable for selective transport of one charge selected from electrons and holes.

Furthermore, for example, the polymerizable functional group may be a functional group that has a styrene skeleton, a silane skeleton, an oxetane skeleton, an acrylate skeleton, or a trifluorovinylether skeleton.

Such a polymerizable functional group can easily bond with the basic molecular skeleton, and is polymerized under relatively moderate conditions; thus, a polymer of the organic material can be easily formed.

Furthermore, for example, the organic material may be a photopolymerization material or a thermal polymerization material.

In this manner, the organic material is polymerized by irradiation with light or heating, and thus a polymer of the organic material is easily formed.

Furthermore, for example, the organic material may be a thermal polymerization material.

Since the thermal polymerization material is polymerizable merely by heating without using a catalyst or a polymerization initiator, a polymer of the organic material containing little impurities is easily formed.

Furthermore, for example, the polymerizable functional group may be a functional group that has a styrene skeleton.

Such a polymerizable functional group having a styrene skeleton is easily incorporated into the organic material, and due to its excellent polymerizability, a polymer of the organic material is more easily formed.

Furthermore, for example, the organic material may be a compound represented by structural formula (1), structural formula (2), or structural formula (3) below:

(1)

(2)

(3)

Such an organic material is highly available and has excellent polymerizability, and thus a polymer of the organic material is easily formed. Furthermore, such an organic material contains a π-conjugated molecular skeleton. Thus, a charge transport function can be imparted to an organic layer that contains a polymer of the organic material through overlap between the π orbitals of π-conjugated molecular skeletons in the formed layer.

In addition, another aspect of the present disclosure provides an organic device production method including forming a structure that includes at least one electrode and an insulating layer adjacent to the at least one electrode in a plan view, the at least one electrode and the insulating layer each having an upper surface exposed from the structure;

applying a solution containing an organic material containing a polymerizable functional group to the upper surface of the at least one electrode and the upper surface of the insulating layer; and, by polymerizing the organic material, forming an organic layer that contains a polymer of the organic material and that is continuously in contact with the upper surface of the at least one electrode and the upper surface of the insulating layer.

In this manner, since a not-yet-polymerized organic material is applied to the upper surface of the structure in which dissimilar materials, such as the insulating layer and the electrode, are adjacent to each other, there is no interaction between polymer chains compared to when the organic material in a polymer state is applied. Thus, the polymer of the organic material polymerized after application exhibits less bias in characteristics, such as thickness and alignment, caused by the influence of the flux on the boundary between the dissimilar materials. Thus, by employing the production method of this aspect, the nonuniformity of the device characteristics caused by the bias in these characteristics can be suppressed, and the obtained organic device exhibits improved uniformity of device characteristics on the surface on which the organic layer is formed.

Furthermore, for example, the production method may further include removing a solvent in the solution during a period from applying the solution to completion of forming the organic layer.

In this manner, the concentration of the organic material increases, and the reaction speed in the polymerizing step can be increased. As a result, heating or light irradiation for polymerization can be reduced, and degradation of the organic layer to be formed is suppressed. Thus, the device characteristics to be obtained can be improved.

Furthermore, for example, the at least one electrode may include a plurality of electrodes, the insulating layer may be disposed between the plurality of electrodes, in forming the organic layer, the organic layer may be continuously formed in contact with upper surfaces of the plurality of electrodes and the upper surface of the insulating layer, and a width of the insulating layer between the plurality of electrodes in a plan view may be between a thickness of the organic layer and a thickness of the solution applied to the upper surfaces of the plurality of electrodes and the upper surface of the insulating layer.

In this manner, the thickness of the applied solution is larger than the width of the insulating layer between the adjacent electrodes, in other words, the distance between the positions where the boundaries of the dissimilar materials are. Since the influence of the boundary between the dissimilar materials weaken with the increasing distance from the boundary, the organic material is polymerized from a solution of the organic material applied in a further highly uniform state. Thus, the uniformity of organic layer is further improved.

An organic device according to another aspect of the present disclosure includes at least one electrode, an insulating layer adjacent to the at least one electrode in a plan view, and an organic layer that is continuously in contact with an upper surface of the at least one electrode and an upper surface of the insulating layer, the organic layer containing a polymer of an organic material, the polymer being insoluble in a solvent.

The following embodiments of the present disclosure are described with reference to the drawings.

In this description, the elements that are essential for the operation of the organic device but not necessary for describing the present disclosure are omitted from the description. For example, the detailed description of matters already well known and redundant descriptions of the substantially identical structures may be omitted. This is to avoid unnecessary redundancy in the following description and help a person skilled in the art understand the present disclosure. It should be noted that the attached drawings and the following descriptions are for helping a person skilled in the art gain a full understanding of the present disclosure, and are not intended to limit the subjects recited in the claims.

Moreover, the drawings are conceptual and are prepared without considering the details of shapes, scales, etc., that are unnecessary for describing the present disclosure.

Moreover, in the drawings, elements that have substantially the same structure, performance, and effects are denoted by the same reference signs. In addition, the numerical values described below are all merely examples for specifically describing the present disclosure, and the present disclosure is not limited to the numerical values disclosed herein. Furthermore, the connection relationships among the constituent elements are merely examples for specifically describing the present disclosure, and the connection relationships for realizing the functions of the present disclosure are not limited by these.

Furthermore, all of the embodiments described below are comprehensive or specific examples. The numerical values, shapes, materials, constituent elements, arrangement and connection forms of the constituent elements, steps, step sequence, etc., described in the embodiments below are merely examples and are not intended to limit the present disclosure.

Moreover, unnecessary detailed descriptions may be omitted.

In this description, terms, such as parallel and orthogonal, that indicate the relationships among the elements, terms that indicate the shapes of the elements, terms such as identical, uniform, etc., and numerical ranges are not merely strict terms but may encompass substantially equivalent ranges, for example, a margin of about several percent.

In this description, the terms "upper" and "lower" do not mean the up direction (perpendicularly upward) and the down direction (perpendicularly downward) in the absolute space recognition, but are used to specify relative positional relationships in a multilayer structure on the basis of the order in which layers are stacked. In addition, the terms "upper" and "lower" are used not only in the cases where two constituent elements are spaced from each other and another constituent element is present between the two constituent elements, but also in the cases where the two constituent elements are in close contact with each other. Moreover, "plan view" means that the organic device is viewed along a direction perpendicular to the main surface of the organic layer of the organic device.

First Embodiment

Hereinafter, an organic device according to a first embodiment is described.

Overall Structure of Organic Device

Figure 1:
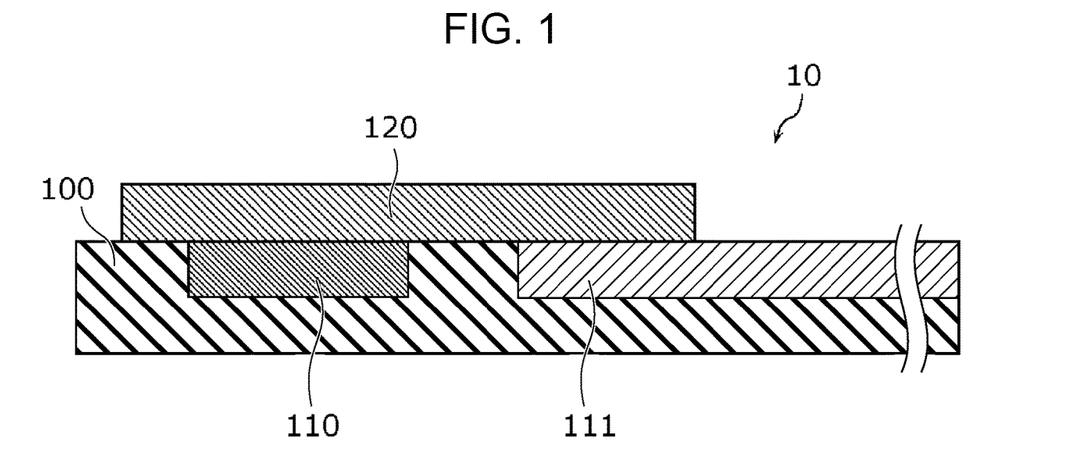
FIG. 1 is a schematic cross-sectional view illustrating the structure of an organic device according to a first embodiment.

First, an overall structure of an organic device according to this embodiment is described. FIG. 1 is a schematic cross-sectional view illustrating the structure of an organic device 10 according to this embodiment.

The organic device 10 according to this embodiment includes an organic layer. The organic device 10 is used in, for example, an organic imaging device, an organic EL, or an organic solar cell. As illustrated in FIG. 1, the organic device 10 includes an electrode 110, an electrode 111, an insulating layer 100 adjacent to the electrode 110 and the electrode 111 in a plan view, and an organic layer 120 that is continuously formed in contact with upper surfaces of the electrode 110, the electrode 111, and the insulating layer 100. The electrode 110 and the electrode 111 are embedded in the insulating layer 100. The upper surfaces of the electrode 110, the electrode 111, and the insulating layer 100 constitute one flat surface. In other words, the upper surface of the electrode 110, the upper surface of the electrode 111, and the upper surface of the insulating layer 100 do not have a height difference and are flat, in other words, flush. The organic device 10 may be void of any one of the electrode 110 and the electrode 111, in other words, the organic device 10 may include only the electrode 110 or the electrode 111.

Although not illustrated in the drawings, the electrode 110 and the electrode 111 are connected, via an in-plane or via wire, to an in-plane or underlying electrode layer, and an electrical circuit is formed thereby.

The material for the electrode 110 and the electrode 111 is a conductive material. Examples of the material for the electrode 110 and the electrode 111 include conductive materials such as (i) low-resistance metals or alloys thereof such as Cu, aluminum (Al), copper silicide (CuSi), and aluminum silicide (AlSi), (ii) noble metals such as gold (Au), silver (Ag), and platinum (Pt), and (iii) metal nitrides or metal oxynitrides such as titanium nitride ($TiN_x$), tantalum nitride ($TaN_x$), tungsten nitride ($WN_x$) tantalum silicide nitride ($TaSiN_x$), tantalum aluminum nitride ($TaAlN_x$), titanium oxynitride ($TiN_xO_y$), and titanium silicide oxynitride ($TiSi_xN_yO_z$).

The material for the insulating layer 100 is an insulating material. Examples of the material for the insulating layer 100 include insulating inorganic materials such as silicon oxide ($SiO_x$), silicon nitride ($SiN_x$), silicon oxynitride ($SiO_xN_y$), aluminum oxide ($AlO_x$), aluminum nitride ($AlN_x$), and aluminum oxynitride ($AlO_xN_y$); and insulating organic materials such as parylene and polyimide.

The organic layer 120 is continuously formed in contact with the upper surfaces of the electrode 110, the electrode 111, and the insulating layer 100. In other words, the organic layer 120 extends across the upper surfaces of the electrode 110, the electrode 111, and the insulating layer 100 so as to cover the electrode 110, the electrode 111, and the insulating layer 100. The organic layer 120 contains a polymer of an organic material. In other words, the organic layer 120 contains a polymerized organic material. In the organic layer 120, for example, the alignment state of the polymer of the organic material is uniform. The organic layer 120 has, for example, a uniform thickness. As such, since the thickness and the alignment state are uniform in the organic layer 120, the uniformity of the organic device 10 is improved.

The organic material has a basic molecular skeleton for charge transport and a polymerizable functional group for polymerizing the organic material by crosslinking basic molecular skeletons. The polymer of the organic material is obtained by polymerizing the organic material through the polymerizable functional group. The polymer of the organic material has a structure in which polymerizable functional groups are polymerized between basic molecular skeletons. The polymerizable functional groups covalently bond with the basic molecular skeletons, for example. Since the organic material contains the basic molecular skeleton and the polymerizable functional group, a functionality can be easily imparted to the organic layer 120 without using other materials if the basic molecular skeleton has a functionality such as charge transport.

Examples of the basic molecular skeleton include the molecular skeletons represented by structural formulae below, and include π-conjugated molecular skeletons such as a triphenylamine skeleton, a fluorene skeleton, a triphenylene skeleton, a carbazole skeleton, and molecular skeletons of derivatives thereof.

Triphenylamine

Fluorene

Triphenylene

Carbazole

The organic material may contain one basic molecular skeleton in one molecule, or two or more basic molecular skeletons in one molecule. When the organic material has multiple basic molecular skeletons, these basic molecular skeletons may be the same or different. The basic molecular skeleton is not limited to the molecular skeletons described as examples above. The basic molecular skeleton may be a molecular skeleton that has a π-conjugated system other than those molecular skeletons described as the examples above, or a molecular skeleton from which a π-conjugated system is formed after polymerization.

In the organic layer 120 that contains a polymer of an organic material that has, as the basic molecular skeleton, a π-conjugated molecular skeleton, charges are transported through overlap between the π orbitals of the basic molecular skeletons in the formed layer. Simultaneously, by selecting a polymer of an organic material having a highest occupied molecular orbital (HOMO) level and a lowest unoccupied molecular orbital (LUMO) level that suit the purpose, one charge selected from electrons and holes can be selectively transported. For example, when the basic molecular skeleton is a π-conjugated molecular skeleton represented by the aforementioned structural formula, the HOMO level and the LUMO level of the polymer of the organic material can be easily adjusted to energy levels suitable for selective transport of charges selected from electrons and holes.

The polymerizable functional group is, for example, a functional group that has a molecular skeleton represented by the following structural formula, and examples of the polymerizable functional group include functional groups having polymerizable molecular skeletons, such as a styrene skeleton, a silane skeleton, an oxetane skeleton, an acrylate skeleton, a trifluorovinylether skeleton, and derivatives of these molecular skeletons. A functional group that has a molecular skeleton represented by any of the following structural formulae easily bonds to the basic molecular skeleton and polymerization can be performed under relatively moderate conditions; thus, a polymer of the organic material can be easily formed.

The organic material may contain one polymerizable functional group in one molecule, or two or more polymerizable functional groups in one molecule. From the viewpoint of increasing the polymerizability of the organic material, two or more polymerizable functional groups may be contained in one molecule of the organic material. The polymerizable functional group is not limited to the functional groups described as examples above. The polymerizable functional group may be a functional group, other than those described above, that can be polymerized by heat, light, a catalyst, or the like and that can covalently bond to the basic molecular skeleton. For example, the polymerizable functional group may have a substituent at some site of the functional group described as an example above. Moreover, the polymerizable functional group may be partly contained in the basic molecular skeleton.

From the viewpoint of ease of polymerization, the organic material is, for example, a photopolymerization material or a thermal polymerization material. A photopolymerization material is a compound that contains, as a polymerizable functional group, a functional group, such as a functional group having an oxetane skeleton or an acrylate skeleton, that can be polymerized by a photoacid generator or a photoradical generator, for example. The thermal polymerization material is a compound that has a functional group, such as a functional group having a styrene skeleton or a trifluorovinylether skeleton, that can be polymerized by heat. A functional group having a silane skeleton generates side-reaction products and thus needs to be heat-treated to remove the side-reaction products; however, the advantage is that room-temperature spontaneous polymerization is possible in the presence of minute amounts of water or hydroxyl groups.

The organic material may be a thermal polymerization material from the viewpoint that polymerization can be carried out without using a catalyst, such as a photoacid generator or a photoradical generator, or a polymerization initiator. When the organic material is a thermal polymerization material, the thermal polymerization material may contain a polymerizable functional group having the aforementioned styrene skeleton from the viewpoint of ease of incorporation into the organic material and excellent polymerizability. Furthermore, when the organic material is a thermal polymerization material, the thermal polymerization material may have a basic molecular skeleton that has multiple aromatic rings, such as the aforementioned π-conjugated molecular skeletons. As a result, the organic material acquires a large molecular weight, becomes less volatile, and thus tends to exhibit high thermal stability. Thus, a polymer of the organic material with few defects is easily obtained, and the device characteristics of the organic device 10 can be improved.

Specific examples of the organic material include compounds represented by structural formulae (1) to (7) below.

(1)

(2)

-continued (3)

(4)

(5)

(6)

(7)

The organic material may be VB-FNPD (9,9-bis[4-[(4-ethenylphenyl)methoxy]phenyl]-N2,N7-di-1-naphthalenyl-N2,N7-diphenyl-9H-fluorene-2,7-diamine) represented by structural formula (1), VNPB (N4,N4'-di(naphthalen-1-yl)-N4,N4'-bis(4-vinylphenyl)biphenyl-4,4'-diamine) represented by structural formula (2), or QUPD (N4,N4'-bis(4-(6-((3-ethyloxetan-3-yl)methoxy)hexyloxy)phenyl)-N4, N4'-bis(4-methoxyphenyl)biphenyl-4,4'-diamine) represented by structural formula (3) among these. These organic materials are highly available and have excellent polymerizability. These organic materials contain π-conjugated molecular skeletons. Thus, a charge transport function can be imparted to an organic layer that contains a polymer of the organic material through overlap between the π orbitals of π-conjugated molecular skeletons in the formed layer.

The polymer of the organic material may be insoluble in solvents. The organic material polymer insoluble in solvents cannot be dissolved in a solvent and applied; thus, polymerization occurs on the upper surfaces of the electrode 110, the electrode 111, and the insulating layer 100, or the organic material polymer is preliminarily formed into a thin film and stacked. Thus, the step of applying a solution of the organic material polymer is not employed, and a bias in the characteristics of the polymer of the organic material caused by the influence of the flux on the boundaries of dissimilar materials is suppressed. In other words, the uniformity of the organic layer 120 is increased. In addition, since the polymer of the organic material is insoluble in solvents, when an additional layer is formed on the organic layer 120 by coating using a solvent, the solvent used in forming the additional layer rarely affects the device characteristics, and thus degradation of the device characteristics of the organic device 10 is suppressed.

The solvent is, for example, a solvent that can dissolve the aforementioned organic material. Specific examples of the solvent include organic solvents such as toluene, xylene, chlorobenzene, dichlorobenzene, dichloroethane, chloroform, tetrahydrofuran (THF), and dimethylformamide. Furthermore, insoluble in a solvent means that the polymer of an organic material is substantially insoluble, and, for example, means that even when the polymer of the organic material is immersed in a solvent, the polymer does not dissolve completely.

The organic layer 120 may contain a polymer of an organic material polymerized after the organic material is applied to the upper surfaces of the electrode 110, the electrode 111, and the insulating layer 100. Specifically, the organic layer 120 is formed by performing a polymerization process after the solution containing an organic material constituted by molecules having a basic molecular skeleton and a polymerizable functional group is applied by a solution method.

Furthermore, the organic layer 120 may contain an organic material that contains an unpolymerized polymerizable functional group. In this manner, when the microstructure of the organic layer 120 changes due to a heat treatment, stress, or the like after formation of the organic layer 120, a not-yet-polymerized polymerizable functional group that has moved to a new reactive site is polymerized, and thus the stability of the microstructure is increased, and the uniform state of the organic layer 120 can be retained.

Organic Device Production Method

Next, a method for producing the organic device 10 according to an embodiment is described.

Figure 2:
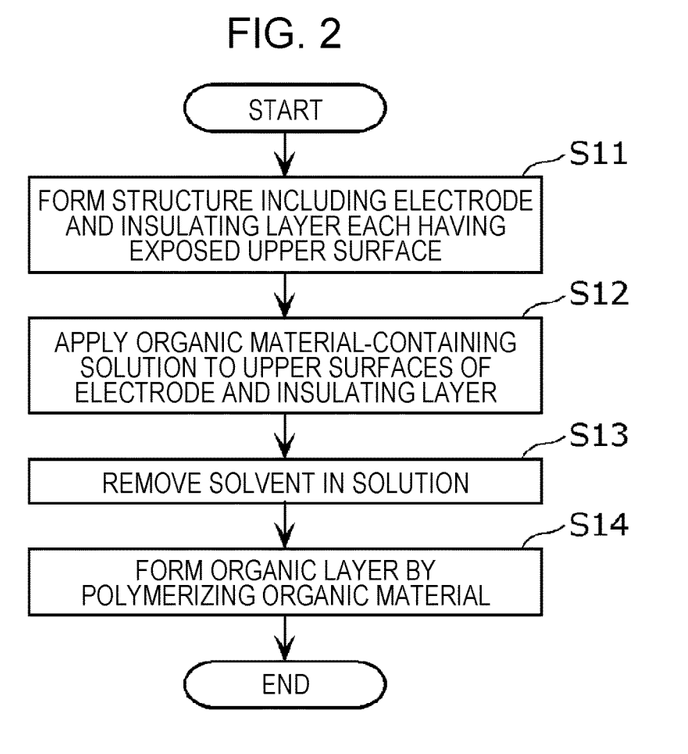
FIG. 2 is a flowchart illustrating a method for producing the organic device according to the first embodiment.

FIG. 2 is a flowchart illustrating a method for producing the organic device 10 according to this embodiment.

The method for producing the organic device 10 according to this embodiment includes a forming step, an applying step, a removing step, and a polymerizing step.

As illustrated in FIG. 2, in the method for producing the organic device 10, first, in the forming step, a structure that includes an electrode 110, an electrode 111, and an insulating layer 100 adjacent to the electrode 110 and the electrode 111 in a plan view, in which upper surfaces of the electrode 110, the electrode 111, and the insulating layer 100 are exposed is formed (step S11). Such a structure is formed by a typical semiconductor process, such as chemical mechanical polishing (CMP), formation of a planarizing layer, and etch-back.

Next, in the applying step in the method for producing the organic device 10, a solution that contains an organic material having a polymerizable functional group is applied to upper surfaces of the electrode 110, the electrode 111, and the insulating layer 100 (step S12). For example, the solution is continuously applied to the upper surfaces of the electrode 110, the electrode 111, and the insulating layer 100. Examples of the method for applying an organic material-containing solution include applying methods such as spin coating dip coating, and spray coating using a solution (hereinafter may be referred to as an ink) in which the organic material is dissolved in a solvent; and printing methods, such as lithography, gravure printing, and inkjet printing, that use liquid inks. The aforementioned solvents can be used as the solvent.

Next, in the removing step in the method for producing the organic device 10, the solvent in the organic material-containing solution is removed (step S13). Examples of the method for removing the solvent include typical methods in which a structure having a solution applied thereto is heated and then vacuumed, or is vacuum-heated. In this manner, the concentration of the organic material increases, and the reaction speed in the polymerizing step described below can be increased. When the structure having the solution applied thereto is heated, the heating temperature is, for example, higher than or equal to the boiling point of the solvent.

In the method for producing the organic device 10, the removing step may be omitted.

Next, in the polymerizing step in the method for producing the organic device 10, the organic material is polymerized so as to continuously form an organic layer 120, which contains the polymer of the organic material, in contact with the upper surfaces of the electrode 110, the electrode 111, and the insulating layer 100 (step S14). In other words, the organic layer 120 is formed to extend across the upper surfaces of the electrode 110, the electrode 111, and the insulating layer 100. As a result, an organic device 10 is obtained. An example of the method for polymerizing the organic material is a method that involves applying an external stimulus such as heat or light to the organic material. When applying the external stimulus, a catalyst such as an acid generator, a radical generator, or an organic metal catalyst may be used with the organic material. A required amount of the catalyst may be mixed with the solution, or the catalyst may be diffused and infiltrated after application of the solution.

When the basic molecular skeleton or the polymerizable functional group in the organic material is of a type that undergoes property degradation by electron exchange with oxygen or moisture, the organic material may be polymerized in a dry atmosphere or in a deoxidizing atmosphere. When the solvent remains upon completion of the polymerization process of the organic material, the remaining solvent is removed by heating or the like.

In the polymerizing step, an organic layer 120 containing an organic material containing an unpolymerized polymerizable functional group may be formed by adjusting the polymerization conditions, polymerization time, etc.

Specifically, an organic layer 120 is formed by applying, by spin-coating, an o-xylene solution of VB-FNPD represented by structural formula (1) serving as the organic material to upper surfaces of the electrode 110, the electrode 111, and the insulating layer 100 in a dry and deoxidizing atmosphere, and then polymerizing the applied solution by heating at 200° C. for 30 minutes. Here, for example, $SiO_x$ is used as the material for the insulating layer 100, and Cu is used as the material for the electrode 110 and the electrode 111. Hereinafter, the effects obtained by forming the organic layer 120 in such a manner are described.

The insulating layer 100 formed of $SiO_x$ and the electrode 110 and the electrode 111 formed of Cu have different surface energy structures. In the $SiO_x$ surface, a highly polar structure such as Si—O—Si, and a highly polar and highly hydrogen-bonding structure such as Si—O—H are exposed, and the $SiO_x$ surface is a polar surface as a whole. Thus, the $SiO_x$ surface has a low polarizable interaction with o-xylene, which is a low-polarity solvent, but high polarity uniformity, and thus the interfacial flowability with o-xylene is excellent. In contrast, the Cu surfaces, which are the surfaces of the electrode 110 and the electrode 111 formed of Cu, have a structure in which Cu has partially oxidized, and, in a dry and deoxidizing atmosphere, the influence of the unoxidized Cu structure is exhibited, and the surface polarity has large local variations. Thus, although the Cu surface and the o-xylene have excellent wettability with each other, the polarity nonuniformity caused by local oxidation in the Cu surface decreases the interfacial flowability with o-xylene. As such, the interfacial flowability with o-xylene differs between the $SiO_x$ surface and the Cu surface.

From the applying step to the polymerizing step, the process of spreading the solution onto the upper surfaces of the electrode 110, the electrode 111, and the insulating layer 100 and the process of volume contraction of the solution caused by evaporation of the solvent progress sequentially or partly simultaneously. During the respective processes, the solution flows over the upper surfaces of the insulating layer 100, the electrode 110, and the electrode 111; however, due to the difference between the interaction between the solvent and the insulating layer 100 and the interaction between the solvent and the electrode 110 and the electrode 111, the flux of the solution is affected. In particular, the magnitude of the interaction changes on the boundary between the insulating layer 100 and the electrode 110 and on the boundary between the insulating layer 100 and the electrode 111, and on these boundaries, the change in the magnitude of the interaction gives a new driving force to the force of the solution flowing in parallel to the upper surfaces of the electrode 110, the electrode 111, and the insulating layer 100. In other words, the flux of the solution becomes nonuniform on the surfaces of the insulating layer 100, the electrode 110, and the electrode 111.

When a solution of a high-molecular-weight material in which the intermolecular interaction is strong and the viscosity of the solution is high even at a low concentration, the nonuniform flux of the solution affects the molecular alignment of the high-molecular-weight material. For example, the high-molecular-weight material is microscopically and microscopically affected by, for example, the force that aligns molecules in the solution wet-spreading direction or in the volume contraction direction, and the force that disturbs alignment associated with the turbulent flow. Thus, compared to when a solution of a high-molecular-weight material flows on the surface of a homogeneous material, the uniformity of the alignment state of the high-molecular-weight material is degraded in the solution and in a subsequently formed thin-film organic layer. In addition, due to the nonuniform alignment state, the thickness of the thin film becomes nonuniform.

Meanwhile, a low-molecular-weight material has smaller intermolecular interactions, and thus, at the same concentration as the high-molecular-weight material, the viscosity of the solution rarely increases, and the influence of the random molecular motions due to heat is large. As a result, the flux of the solution rarely affects the molecular alignment of a low-molecular-weight material. Accordingly, in the solution, the uniformity of the alignment state of the low-molecular-weight material is excellent. In other words, the basic molecular skeletons of the organic material tend to align in random directions.

Thus, the organic layer 120 that contains a polymer (in other words, a high-molecular-weight material) of an organic material formed by heat-polymerizing a low-molecular-weight organic material, VB-FNPD, represented by structural formula (1) after application by the solution method assumes a state in which the basic molecular skeletons are crosslinked and polymerized with one another in random directions irrespective of the positions on the upper surfaces of the insulating layer 100, the electrode 110, and the electrode 111. Thus, the uniformity of the local structures, such as the alignment state of the polymer of the organic material in the organic layer 120, is excellent. Moreover, the uniformity of the thickness of the organic layer 120 is also excellent. As a result, the uniformity of the device characteristics of the organic device 10 improves on the surface on which the organic layer 120 is formed.

Second Embodiment

Next, an organic device according to a second embodiment is described. In the description of the second embodiment below, the differences from the first embodiment are mainly described, and descriptions of common features are omitted or simplified.

Figure 3:
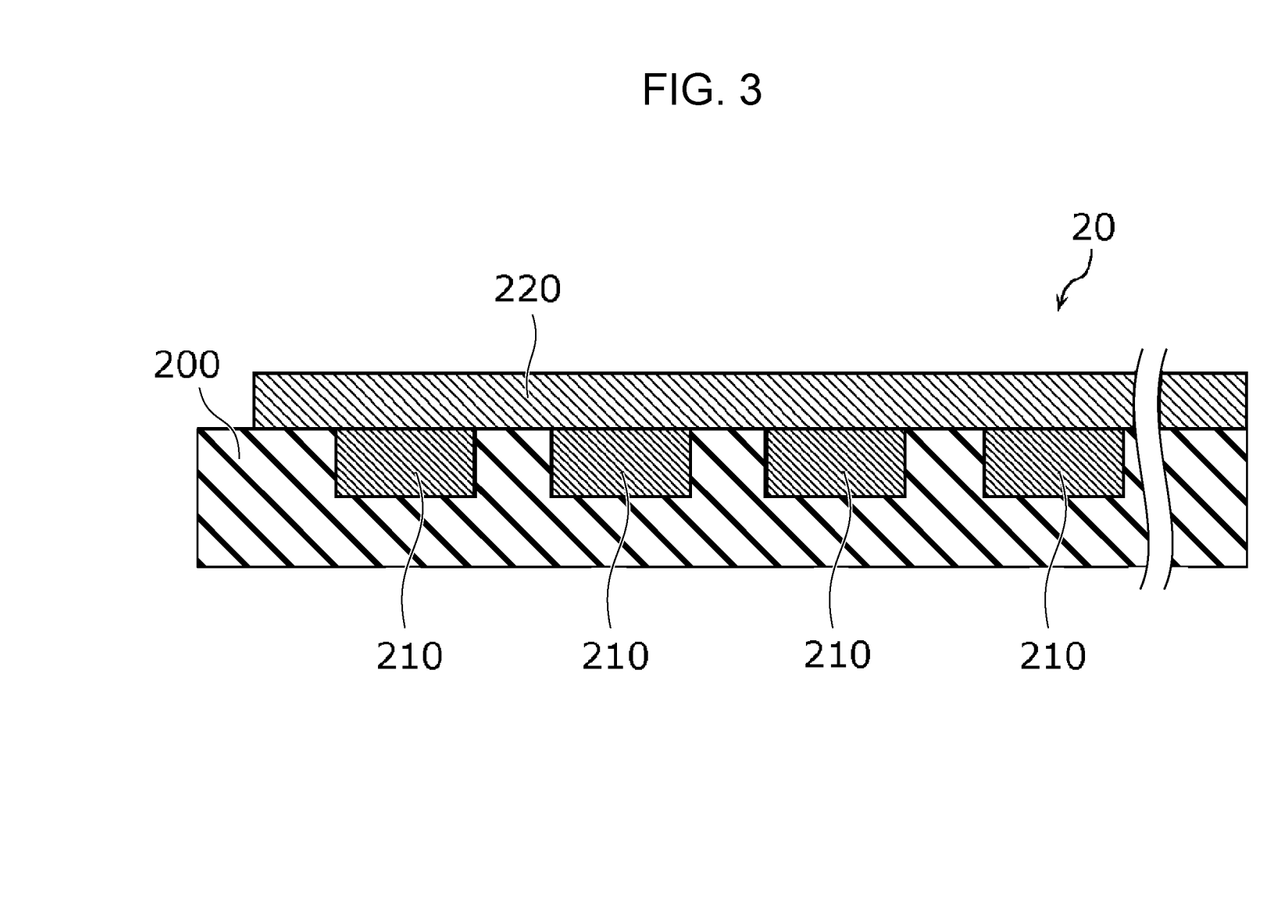
FIG. 3 is a schematic cross-sectional view illustrating the structure of an organic device according to a second embodiment.
Figure 4:
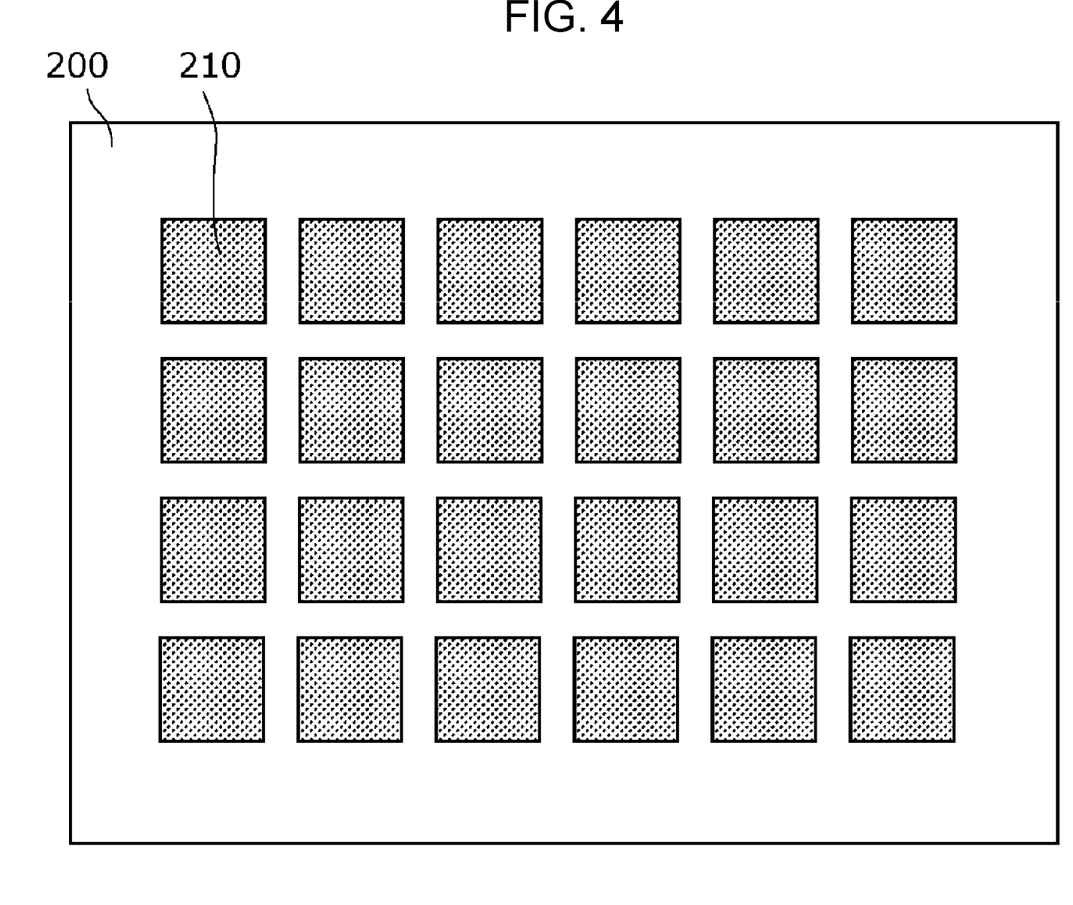
FIG. 4 is a plan view illustrating an example of a planar layout of multiple electrodes according to the second embodiment.

FIG. 3 is a schematic cross-sectional view illustrating the structure of an organic device 20 according to this embodiment. FIG. 4 is a plan view illustrating an example of a planar layout of multiple electrodes 210 according to this embodiment. In FIG. 4, a state in which an organic layer 220 is not formed is illustrated to show the planar layout of electrodes 210. Compared to the organic device 10, the organic device 20 is different in that there are multiple electrodes 210 arranged in a matrix instead of the electrode 110 and the electrode 111.

As illustrated in FIG. 3, the organic device 20 includes the electrodes 210, an insulating layer 200 disposed between the electrodes 210 in a plan view, and the organic layer 220. The electrodes 210 are embedded in the insulating layer 200. The upper surfaces of the electrodes 210 and the insulating layer 200 constitute one flat surface. In other words, the upper surfaces of the electrodes 210 and the upper surface of the insulating layer 200 are flush. Although not illustrated in the drawings, the electrodes 210 are connected to, through in-plane or via wires, an in-plane or underlying electrode layer, and an electrical circuit is formed thereby.

The materials that can be used for the insulating layer 200 are the same as those for the insulating layer 100.

As illustrated in FIG. 4, the electrodes 210 are arranged into a matrix having four rows and six columns in a plan view and are equally spaced from one another. Each of the electrodes 210 has a square shape in a plan view. The shape of the electrodes 210 in a plan view and the number and arrangement of the electrodes 210 are not limited to the example illustrated in FIG. 4. The shape of the electrodes 210 in a plan view may be a circular shape or a regular polygon shape such as a regular hexagon shape or regular octagon shape. The electrodes 210 may be arranged in equal numbers of rows and columns, or may be arranged into one column.

The material that can be used for the electrodes 210 is the same as that for the electrode 110 and the electrode 111.

The description is continued by again referring to FIG. 3. The organic layer 220 is continuously formed in contact with the upper surfaces of the electrodes 210 and the insulating layer 200. In other words, the organic layer 220 extends across the upper surfaces of the electrodes 210 and the insulating layer 200 to cover the electrodes 210 and the insulating layer 200. The material used for the organic layer 220 is the same as that for the organic layer 120.

The organic device 20 can be produced by the same method as the method for producing the organic device 10 according to the first embodiment.

Specifically, the organic device 20 is formed by the following method, for example. First, a 0.5 wt % THF solution of a mixture of an organic material, QUPD represented by structural formula (3), and a polymerization initiator, 4-octyloxydiphenyliodonium hexafluoroantimonate in an amount 1 wt % of the QUPD is applied to upper surfaces of the electrodes 210 and the insulating layer 200 by spin coating all at once. Subsequently, ultraviolet (UVA) is applied from an ultraviolet light, and a polymerization process is performed by heating at 120° C. As a result, an organic layer 220 having a thickness of 40 nm is formed. For this process, for example, $SiO_x$ is used as the material for the insulating layer 200, and $TaN_x$ is used as the material for the electrodes 210.

In the organic layer 220 produced as such, the influence of the boundaries between the surfaces of dissimilar materials is small, and thus local uniformity on the boundaries between the electrodes 210 and the insulating layer 200 is improved.

Moreover, the uniformity on the boundary between the electrodes 210 and the insulating layer 200 outside the matrix of the electrodes 210 and the uniformity on the boundary between the electrodes 210 and the insulating layer 200 inside the matrix of the electrodes 210 are also improved.

In the method for producing the organic device 20, in the polymerizing step, the organic layer 220 is continuously formed to be in contact with the upper surfaces of the electrodes 210 and the insulating layer 200. In other words, the organic layer 220 is formed to extend across the upper surfaces of the electrodes 210 and the insulating layer 200. In the polymerizing step, from the viewpoint of improving the uniformity of the organic layer 220, a smaller width selected from a width of an electrode 210 and a width of the insulating layer between adjacent electrodes 210 in a plan view may fall between the initial thickness of the solution applied in the applying step and the thickness of the organic layer 220 formed by the polymerizing step. The width of the insulating layer between adjacent electrodes 210 is, in other words, the width of a portion of the insulating layer 200 located in the gap between adjacent electrodes 210 in the aligning direction in a plan view. When the shape of the electrodes 210 in a plan view is a shape other than the square, the width of the electrodes 210 is the width at a position where the distance between opposing sides of an electrode 210 in a plan view is the shortest.

In the example of forming the organic layer 220 described above, since the organic layer 220 having a thickness of 40 nm is formed by using a 0.5% solution, the initial thickness of the solution in the applying step is about 40 nm 0.005=8000 nm. Thus, when a smaller width selected from the width of the electrodes 210 and the width of the insulating layer 200 between adjacent electrodes 210 in a plan view falls between 8000 nm, that is, the initial thickness of the solution in the applying step, and 40 nm, that is, the thickness of the organic layer 220, the effect of improving the uniformity of the organic layer 220 is enhanced.

When the density of the electrodes 210 in a plan view is increased, the width of the insulating layer 200 between the adjacent electrodes 210 is smaller than the width of the electrodes 210. In such a case, the width of the insulating layer 200 between the adjacent electrodes 210 may fall between the thickness of the solution applied in the applying step and the thickness of the organic layer 220 formed in the polymerizing step. Thus, in the organic device 20, the width of the insulating layer 200 between the adjacent electrodes 210 may be larger than the thickness of the organic layer 220.

Third Embodiment

Next, an organic device according to a third embodiment is described. In the description of the third embodiment below, the differences from the first and second embodiments are mainly described, and descriptions of common features are omitted or simplified.

Figure 5:
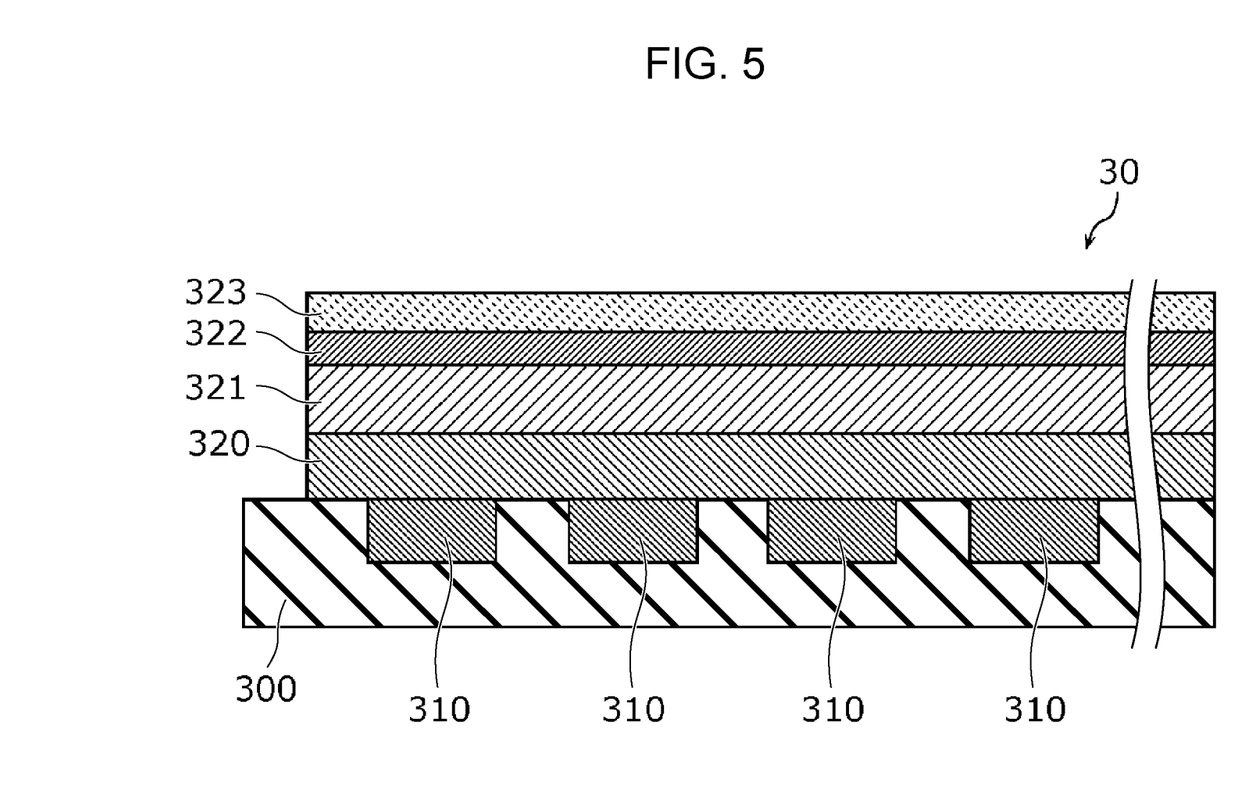
FIG. 5 is a schematic cross-sectional view illustrating the structure of an organic device according to a third embodiment.

FIG. 5 is a schematic cross-sectional view illustrating the structure of an organic device 30 according to this embodiment. The organic device 30 differs from the organic device 10 and the organic device 20 in that a photoelectric conversion layer 321, a buffer layer 322, and a counter electrode 323 are included. The organic device 30 is, for example, an organic imaging device.

As illustrated in FIG. 5, the organic device 30 includes the electrodes 310, an insulating layer 300 disposed between the electrodes 310 in a plan view, and an organic layer 320. The organic device 30 further includes the photoelectric conversion layer 321 disposed on the organic layer 320, and the counter electrode 323 disposed on the photoelectric conversion layer 321. If necessary, the organic device 30 may further include a buffer layer 322 interposed between the photoelectric conversion layer 321 and the counter electrode 323.

The material for the insulating layer 300 can be the same as the material for the insulating layer 100.

The electrodes 310 are pixel electrodes for reading out charges generated by the photoelectric conversion layer 321. As with the electrodes 210, the electrodes 310 are arranged into a matrix in a plan view. Although not illustrated, the electrodes 310 are connected to an underlying readout circuit through via wires, for example, and collect charges generated in the photoelectric conversion layer 321, and transmit the charges to the readout circuit. In addition, for example, the electrodes 310 are connected to a charge accumulating unit through via wires, charges generated in the photoelectric conversion layer 321 are accumulated in the charge accumulating unit, and signals corresponding to the accumulated charges are read out by the readout circuit. The material that can be used for the electrodes 310 is the same as that for the electrode 110 and the electrode 111.

The material used for the organic layer 320 is the same as that for the organic layer 120. When the organic layer 320 has the aforementioned basic molecular skeletons, the organic layer 320 can transport one charges selected from electrons and holes by adjusting the HOMO level and the LUMO level of the polymer of the organic material; thus, the organic layer 320 functions as a charge block layer. The charge block layer suppresses injection of unnecessary charges from the electrodes 310 into the photoelectric conversion layer 321. As a result, noise in the organic device 30 can be reduced.

The electrodes 310, the insulating layer 300, and the organic layer 320 can be produced by the same method as the method for producing the organic device 10 according to the first embodiment.

The photoelectric conversion layer 321 generates a hole-electron pair upon receiving incident light. The photoelectric conversion layer 321 is constituted by, for example, donor molecules and acceptor molecules. An organic semiconductor polymer such as P3HT (poly(3-hexylthiophene)) is used as the donor molecules. Not only the organic semiconductor polymer but also low-molecular-weight organic semiconductors such as phthalocyanines and naphthalocyanines, semiconductor-type carbon nanotubes, or quantum dots formed of a semiconductor material such as lead sulfide (PbS), lead selenide (PbSe), cadmium selenide (CdSe), or cadmium telluride (CdTe) may be used as the donor molecules.

Examples of the acceptor molecules are molecules that can withdraw charges from the donor molecules, and include PCBM ([6,6]-phenyl-C61-butyric acid methyl ester) and fullerenes such as C60 and SIMEF (silylmethyl fullerene).

The photoelectric conversion layer 321 is formed by, for example, applying a mixture of donor molecules and acceptor molecules to the organic layer 320 and drying the applied solution. Examples of the application method are the same as the method for applying the solution of the organic material described above. The photoelectric conversion layer 321 may also be formed by a vapor deposition method.

The counter electrode 323 is a transparent electrode formed of a transparent conductive material, for example. The counter electrode 323 is disposed on the light-incident side of the photoelectric conversion layer 321. Thus, light that has passed through the counter electrode 323 is incident on the photoelectric conversion layer 321. In this description "transparent" means that at least part of light in the wavelength range to be detected is passed through, and does not necessarily mean that light is transmitted throughout the entire wavelength range of visible light.

Although not illustrated in the drawings, the counter electrode 323 is connected to a voltage supply circuit, and voltage is applied from the voltage supply circuit. When the voltage supply circuit controls the potential of the counter electrode 323 relative to the potential of the electrodes 310, one selected from a hole and an electron in a hole-electron pair generated in the photoelectric conversion layer 321 as a result of photoelectric conversion can be collected as the charge by the electrodes 310. For example, when holes are used as the charges, the potential of the counter electrode 323 is adjusted to be higher than that of the electrodes 310 to selectively collect the holes by the electrodes 310. Alternatively, electrons can be used as the charges, and, in such a case, the potential of the counter electrode 323 is adjusted to be lower than that of the electrodes 310.

Examples of the material for the counter electrode 323 include compounds having both electrical conductivity and transparency for light incident on the photoelectric conversion layer 321, such as compounds obtained by doping indium oxide ($InO_x$) with tin, (Sn), silicon (Si), tungsten (W), or the like such as indium tin oxide (ITO), compounds obtained by doping tin oxide ($SnO_x$) with antimony (Sb), fluorine (F), or the like, and compounds obtained by doping zinc oxide (ZnO) with Al, gallium (Ga), or the like. The counter electrode 323 is formed by, for example, an electron beam method, a sputtering method, a resistive heating vapor deposition method, or a solution coating method.

The buffer layer 322 is disposed to mitigate influence of the sputter process damage, which occurs during formation of the counter electrode 323, on the photoelectric conversion layer 321, or to suppress injection of unnecessary charges from the counter electrode 323 into the photoelectric conversion layer 321, for example. A p-type semiconductor, an n-type semiconductor, or the like is used as the material for the buffer layer 322. For example, by selecting the HOMO level and the LUMO level energy of the material for the buffer layer 322, the buffer layer 322 can selectively transport one charge selected from an electron and a hole, and suppresses injection of unnecessary charges from the counter electrode 323 into the photoelectric conversion layer 321. The buffer layer 322 is formed by, for example, a solution coating method or a vapor deposition method.

Specifically, the organic device 30 is formed by the following method, for example. First, a 10 mg/mL dichloroethane solution of VNPB represented by structural formula (2) serving as the organic material is applied to upper surfaces of the electrodes 310 and the insulating layer 300 by spin coating all at once. Subsequently, the polymerization process is conducted by heating the solution at 110° C. for 10 minutes and then at 230° C. for 90 minutes. As a result, an organic layer 320 having a thickness of 30 nm is formed. Here, for example, tetraethoxysilane (SiO$_x$ obtained by decomposing TEOS is used as the material for the insulating layer 300, and TiN$_x$ is used as the material for the electrodes 310 in plasma chemical vapor deposition (CVD). Furthermore, for example, the width of the electrodes 310 is 2.8 μm, and the width of the insulating layer 300 between the adjacent electrodes 310 is 0.2 μm.

Next, a chloroform solution of a material obtained mixing the donor molecules P3HT and the acceptor molecules PCBM at a 1:1 ratio is applied to the organic layer 320 by spin coating to form a photoelectric conversion layer 321. Furthermore, a counter electrode 323 formed of ITO is formed on the photoelectric conversion layer 321 by a sputtering method, and thus an organic device 30 is obtained.

Hereinafter, the results of measuring the device characteristics of the organic device 30 obtained as such are described. Specifically, +4 V voltage relative to the electrodes 310 is applied to the counter electrode 323, and the readout signal of the dark period (in other words, the period in which light is not applied to the organic device 30) and the readout signal of the uniform visible light irradiation period are acquired, and the uniformity within the matrix of the electrodes 310 is evaluated for each of the readout signals, from which excellent results are obtained.

Meanwhile, an organic device 30 that includes an organic layer 320 formed by applying a solution of a high-molecular-weight material, that is, a composite (PEDOT:PSS) of poly(3,4-ethylenedioxythiophene) and polystyrene sulfonic acid, instead of VNPB is evaluated. As a result, the uniformity of the readout signals is degraded compared to the organic device 30 that includes the organic layer 320 formed by using VNPB. In particular, the organic device 30 formed by using PEDOT:PSS exhibits degraded uniformity during the dark period compared to the organic device 30 that includes the organic layer 320 formed of VNPB, the uniformity in the range of several electrodes 310 is also degraded, and the uniformity in the entire matrix range of the electrodes 310 is degraded.

Other Embodiments

In the description above, one aspect or multiple aspects of the organic device are described through the embodiments, but the present disclosure is not limited by these embodiments.

For example, in the embodiments described above, the organic material has a charge-transporting basic molecular skeleton, and the polymer of the organic material can transport one charge selected from electrons and holes; however, these features are not limiting. The polymer of the organic material may be a photoelectric conversion material in which electrons such as π electrons are excited upon irradiation with light. The polymer of the organic material may have a molecular skeleton other than the π-conjugated molecular skeleton, and may be an insulating material that does not transport charges.

Furthermore, for example, in the embodiments described above, the polymerizing step is performed after the removing step, but this feature is not limiting. The removing step and the polymerizing step may be performed in parallel. In other words, the polymerizing process may be performed while removing the solvent.

Without departing from the gist of the present disclosure, embodiments combined with various alterations conceived by a person skilled in the art and embodiments obtained by combining constituent elements of different embodiments are also within the scope of the present disclosure.

The organic device of the present disclosure is, for example, applicable to a usage that requires uniform device characteristics, such as an organic imaging element and an organic EL display.

What is claimed is:

1. An organic device comprising:
   at least one electrode;
   an insulating layer adjacent to the at least one electrode in a plan view; and
   an organic layer that is continuously in contact with an upper surface of the at least one electrode and an upper surface of the insulating layer, the organic layer containing a polymer of an organic material, wherein;
   the organic material contains a basic molecular skeleton and a polymerizable functional group,
   in the polymer, the organic material is polymerized through the polymerizable functional group,
   the basic molecular skeleton is a π-conjugated molecular skeleton,
   the π-conjugated molecular skeleton is a triphenylamine skeleton, a fluorene skeleton, a triphenylene skeleton, or a carbazole skeleton, and
   the polymerizable functional group is a functional group that has a styrene skeleton, a silane skeleton, an oxetane skeleton, an acrylate skeleton, or a trifluorovinylether skeleton.

2. The organic device according to claim 1,
   wherein the polymer is insoluble in a solvent.

3. The organic device according to claim 1,
   wherein the organic layer contains the organic material that contains the polymerizable functional group that is unpolymerized.

4. The organic device according to claim 1,
   wherein the organic layer includes the polymer of the organic material polymerized after the organic material is applied to the upper surface of the at least one electrode and the upper surface of the insulating layer.

5. The organic device according to claim 1, wherein
   the at least one electrode includes a plurality of electrodes,
   the insulating layer is disposed between the plurality of electrodes in a plan view, and
   the organic layer is continuously in contact with upper surfaces of the plurality of electrodes and the upper surface of the insulating layer.

6. The organic device according to claim 5,
   wherein a width of the insulating layer between adjacent two electrodes among the plurality of electrodes in a plan view is larger than a thickness of the organic layer.

7. The organic device according to claim 5, further comprising:
   a photoelectric conversion layer disposed on the organic layer,
   wherein the plurality of electrodes are a plurality of pixel electrodes.

8. The organic device according to claim 7,
   wherein the organic layer is a charge block layer.

9. The organic device according to claim 1,
   wherein the organic material is a photopolymerization material or a thermal polymerization material.

10. The organic device according to claim 1,
    wherein the organic material is a thermal polymerization material.

11. The organic device according to claim 10,
    wherein the polymerizable functional group is a functional group that has a styrene skeleton.

12. An organic device comprising:
   at least one electrode;
   an insulating layer adjacent to the at least one electrode in a plan view; and
   an organic layer that is continuously in contact with an upper surface of the at least one electrode and an upper surface of the insulating layer, the organic layer containing a polymer of an organic material, wherein:
   the organic material contains a basic molecular skeleton and a polymerizable functional group,
   in the polymer, the organic material is polymerized through the polymerizable functional group, and
   the organic material is a compound represented by structural formula (1), structural formula (2), or structural formula (3) below:

* * * * *